United States Patent [19]

Hagner

[11] Patent Number: 4,580,866
[45] Date of Patent: Apr. 8, 1986

[54] ELECTRICAL CONNECTOR ASSEMBLY HAVING ELECTROMAGNETIC INTERFERENCE FILTER

[75] Inventor: George Hagner, San Jose, Calif.
[73] Assignee: Topocon, Inc., Santa Cruz, Calif.
[21] Appl. No.: 488,958
[22] Filed: Apr. 27, 1983
[51] Int. Cl.[4] ............................................. H03H 7/00
[52] U.S. Cl. ................................. 339/147 R; 333/181
[58] Field of Search ............................ 333/181–185; 339/147 R, 147 P

[56] References Cited

U.S. PATENT DOCUMENTS

| 4,126,840 | 11/1978 | Selvin | 339/147 R |
| 4,144,509 | 3/1979 | Boutros | 339/147 R |
| 4,371,226 | 2/1983 | Brancaleone | 339/147 R |

Primary Examiner—Gil Weidenfeld
Assistant Examiner—Gary F. Paumen
Attorney, Agent, or Firm—Townsend and Townsend

[57] ABSTRACT

An assembly for use as a multiple pin electrical connector having a capability of filtering the electromagnetic interference from the signals passing through the pins of the connector. The assembly includes a filtering interface having an electrically non-conductive body provided with a plurality of generally parallel grooves for receiving respective, individual capacitors. The body has a plurality of pin-receiving holes, each hole communicating with one end of a respective groove. The holes, portions of the grooves, and an outer face of the body adjacent to the outer ends of the grooves are plated with an electrically conductive material. The capacitors placed in respective grooves complete a plurality of electrical paths between the holes and the outer face of the body, such plated outer face defining a ground plane which can be placed in electrical contact with grounded equipment by a screw or other attachment device. The filtering interface can be separate from or integral with an electrical connector member having multiple pins. The filtering interface can be placed between a pair of multiple pin electrical connector members or between an electrical connector member and a printed circuit board.

16 Claims, 3 Drawing Figures

ELECTRICAL CONNECTOR ASSEMBLY HAVING ELECTROMAGNETIC INTERFERENCE FILTER

BACKGROUND OF THE INVENTION

The present invention relates to improvements in electrical connectors of the type having multiple pins or traces and, more particularly, to a connector assembly having an improved filter for filtering electromagnetic signal frequencies to ground.

Conventional multiple pin connectors often require some means for diverting electromagnetic signal frequencies to ground to eliminate interference from such signals. This requirement poses some problems especially where there are numerous pins, such as 25 to 50, carried by a small connector block. In such a case, it is extremely difficult to filter each pin separately from the adjacent pins because of space limitations. Any attempt to do this while keeping space requirements small is extremely difficult. Nonetheless, such filtering must be accomplished in some fashion to assure that proper signal transfer is made through the connector and, at the same time, certain electromagnetic signal frequencies are filtered.

Because of such problems, a need has arisen for an improved electromagnetic interference filter which takes into account all sizes of conventional pin connectors but also requires filtering efficiencies of high quality.

Prior U.S. patents in the filtering of signals on multiple pin connectors include U.S. Pat. Nos. 4,126,480, 4,144,509 and 4,371,226.

SUMMARY OF THE INVENTION

The present invention provides an improved electrical connector assembly of the multiple pin type wherein the assembly has a filter interface means associated therewith for filtering electromagnetic signal frequencies in an efficient manner while keeping the size of the overall assembly small and keeping the pins out of electrical contact with each other. The invention is suitable for use with wire harnesses or can be separate from a connector body.

A unique feature of the present invention is the simple and rugged interconnection achieved between individual pins of a connector and the capacitors and ground connection of the interface means itself. This interconnection is achieved by plating certain surfaces of the electrically non-conducting body of the interface means, the plated surfaces defining current flow paths to a ground plane defined by one side face of the interface body. The plating of all surfaces is accomplished at the same time using conventional plating techniques to minimize costs.

The filtering is achieved by way of filtering capacitors. The filtering interface, when used separately from a connector member with pins, comprises a body of electrically non-conducting material having a pair of opposed faces between which a number of holes extend, the holes being adapted to receive the pins of the connector. One of the end faces has a groove for each hole, respectively, and the grooves generally are parallel with each other and extend to one side face of the interface body. The holes, the grooves, and the one side face are plated to form electrical path segments from the holes to the side face, the plating layers in each groove being interrupted so that, when the groove is fitted with a leadless capacitor, the capacitor bridges the plating segments in the groove so as to complete the path from the layer of plating in an adjacent hole or on an adjacent pin and the plating at the side face. The metal on the plating at the side face extends to one end of the interface body and is adapted to make electrical contact with a mounting screw which mounts the body to ground, such as a chassis or the ground plane of a printed circuit board.

The primary object of the present invention is to provide an improved filtering interface means for a multiple pin electrical connector wherein the filtering of signals on the pins of the connector can be quickly and easily achieved yet the dimensions of the overall assembly can remain small so as to minimize costs and space requirements.

Other objects of this invention will become apparent as the following specification progresses, reference being had to the accompanying drawings for several embodiments of this invention.

In the Drawings

The first embodiment of the electrical connector assembly of the present invention is broadly denoted by the numeral 10 and includes a filtering interface or interface member 12 between a pair of electrical connector members 14 and 16 of generally conventional construction. The purpose of filtering interface 12 is to filter electromagnetic signal frequencies to ground through capacitors carried by the interface member 12 in a manner hereinafter described.

Connector members 14 and 16 can be any type of connector. They serve as the connection between the filtering interface and the outside world. The construction of each connector is not important to the teachings of the present invention only inasmuch as it either:

a. connects to the filtering interface, or b. incorporates the filtering capacitors into the body of the connector.

For a connector of the type described in subparagraph a above, the connector pins will make electrical contact with plating in each hole of the filtering interface, by either a press fit or solder connection in the hole of the filtering interface.

Figure 1:
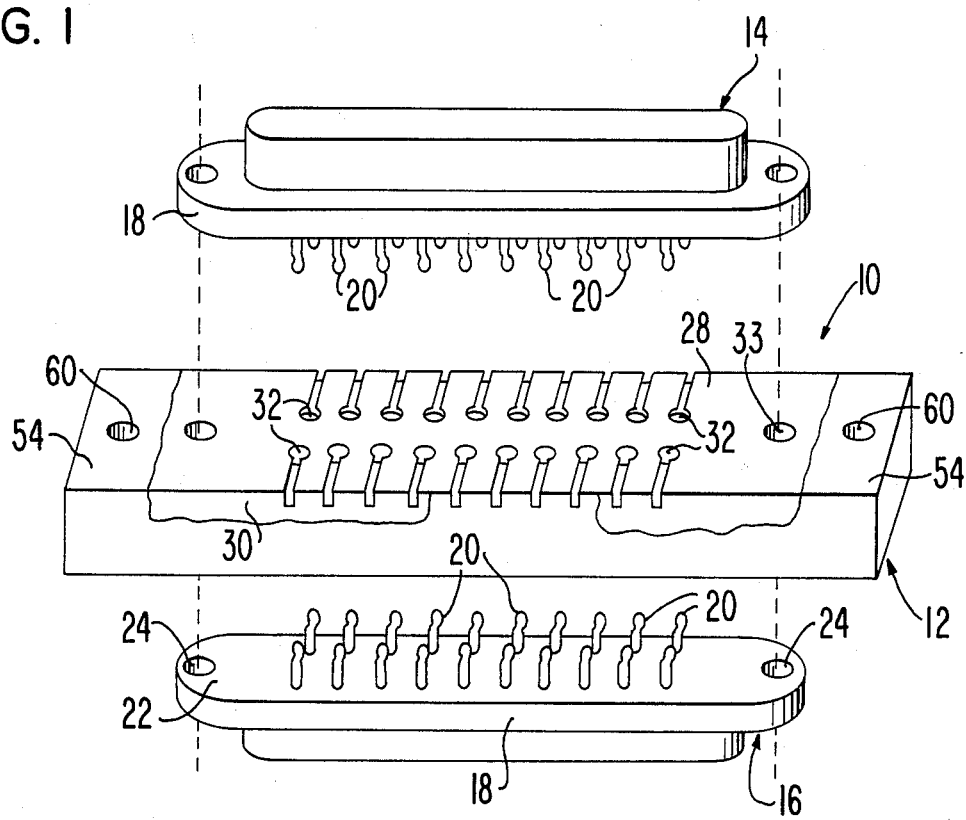
FIG. 1 is a perspective view of a first embodiment a multiple pin connector assembly having a filtering interface incorporating a filter for electromagnetic interference.
Figure 2:
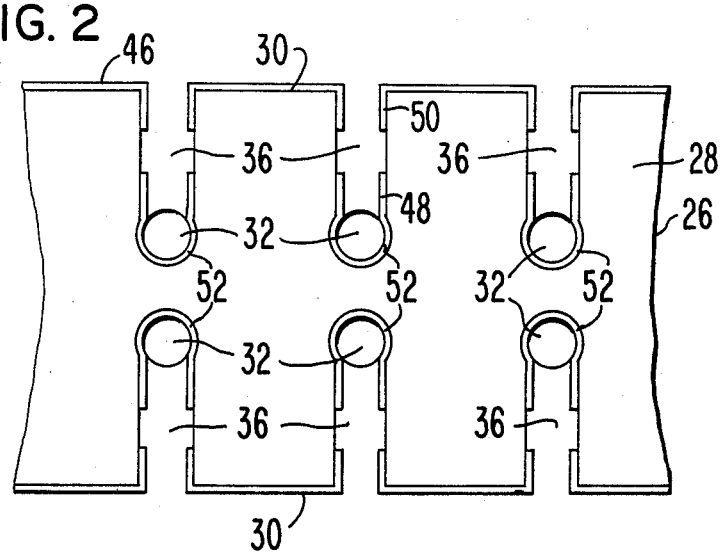
FIG. 2 is an enlarged, fragmentary, top plan view of the filtering interface of FIG. 1.

Filtering interface 12 is comprised of a body 26 of electrically non-conducting material. The body can be of any shape but, for purposes of illustration, it is rectangular and has four flat, outer faces, including a pair of opposed end faces 28, only one of which is shown in FIG. 1, and a pair of side faces 30 (FIG. 2).

Filtering interface 12 has a plurality of holes 32 extending therethrough between end faces 28. These holes are located in the same arrangement as pins 20 of connectors members 14 and 16 so that the holes receive pins 20 as connector members 14 and 16 are moved into operative positions continguous to respective end faces 28. When the connector members 14 and 16 are in their operative positions adjacent to filtering interface 12, the three components are interconnected by screws 25 passing through holes 24 of members 14 and 16 and holes 33 in filtering interface 12. In lieu of using screws, the frictional engagement between pins 20 and interface member 12 when the pins are in holes 32 may be enough to releasably couple connectors 14 and 16 to filtering interface 12.

Figure 1A:
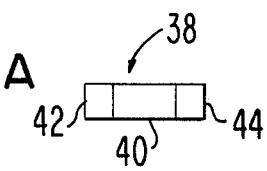
FIG. 1a is a side elevational view of a leadless capacitor used with the filtering interface.

One end face 28 of filtering interface 12 has a plurality of generally parallel grooves 36, there being a groove 36 for each hole 32, respectively. The grooves 36 extend from the respective hole 32 to the adjacent side face 30 as shown in FIG. 2. The depth of each groove is sufficient so that the groove can receive a leadless capacitor 38 (FIG. 1a) which is to be press fitted into the groove. Leadless capacitors are well known and are commercially available. Such a capacitor includes a capacitor body 40 having a pair of end terminals 42 and 44 of electrically conductive material. Leadless capacitors can be extremely small in size such as ¼ inch in length and about 0.050 inch in diameter.

A number of surfaces of filtering interface 12 are plated with a metallic material which has good electrical conductivity, such as copper or the like. Each of the side faces 30 is plated to provide layer 46 (FIG. 2). Also, each groove 36 is plated to present layers 48 and layers 50 which are separated from each other. When a leadless capacitor 38 is placed in a groove 36, it will bridge the gap between layers 48 and 50 so as to provide a current flow path therebetween. Also, each hole 32 is provided with a plating 52 which extends from one face 28 to the opposite end face 28. Also, each layer 52 is integral with the adjacent layer 48, and each layer 46 is integral with adjacent layers 50. Thus, pins 20 within holes 32 will make electrical contact with ground potential through respective layers 52, 48, 50 and 46.

In use, assuming that filtering interface 12 has been plated to form layers 46, 48, 50, and 52, leadless capacitors 38 are placed in grooves 36 in the manner shown in the upper right-hand portion of FIG. 2. Then, connector members 14 and 16 are coupled to filtering interface 12 by forcing pins 20 into respective holes 32 or by soldering. When this occurs, the pins make electrical contact with adjacent layers 52 which, through layers 50 and 48, make electrical contact with layers 46.

Layer 46, shown in FIG. 2, is in electrical contact with a layer 54 on each end portion 56 of filtering interface 12. Each layer 54 makes electrical contact through a screw (not shown) to a grounded chassis or other element in some suitable fashion. Thus, each pin 20 will be filtered by way of a respective leadless capacitor 38 in a corresponding groove 36. All capacitors have a common ground connection; however, the pins 20, when they are in respective holes 32 of filtering interface 12, will be electrically isolated from each other.

The purpose and use of the present invention is to filter electromagnetic signal frequencies to ground through capacitors 38. The unique feature of the present invention is the simple and rugged interconnection achieved between individual pins and ground. The filtering is achieved through the use of filtering interface 12 which assures that each pin 20 is filtered while the pins are electrically insulated from each other.

The electrically non-conducting material forming body 26 of filtering interface 12 is a platable plastic material. A suitable material for this purpose is one identified as Ultem and made by General Electric Company. Another suitable material is one taken from the 1700, 1800 or 8000 series materials of Union Carbide Corporation. Other platable plastics could be used, if desired.

The filtering capacitors 38 can be quickly and easily assembled into grooves 36 and held in place by a press fit, by an adhesive or solder paste, by heat staking or by any other suitable technique to provide a fixed mechanical attachment during or after plating. An electrical connection is obtained between the plated groove and the capacitors either by plating by soldering.

When the filter capacitors are press-fitted in place, filtering interface 12 provides a dual function. It provides an insulated, conductive path from each pin 20 through a respective capacitor to ground. It also provides a firm mechanical attachment for the capacitor by interference fit before, during and after plating.

Assembly of the capacitors can be achieved before plating. In such as a case, the capacitors are plated in place. If the capacitors are assembled after plating, then either the press fit or a subsequent soldering operation will provide the electrical connection.

The capacitors will vary in capacitance depending upon the application to provide the filtering effect. By using leadless capacitors and the filtering interface method, considerable space saving is achieved as opposed to conventional filter methods. Also, the filter interface member 12 can be adapted to existing equipment applications where space is at a premium or where standard connector devices need to be interchangeable with existing equipment.

What is claimed is:

1. In an electrical connector assembly a body having a pair of adjacent faces, one of the faces having a plurality of grooves therein, one end of each groove, respectively, being provided with a hole for receiving an electrically conductive pin and the other end of the groove terminating at the other face of the body, each groove having a pair of spaced electrically conducting inner layers and a capacitor in the groove in spanning relationship to said layers therein, the other face of the body having an outer layer of electrically conducting material thereon in electrical contact with the adjacent layer in each groove, respectively, there being means for making an electrical contact between the layer on said other face and ground, whereby pins received in the holes will have the electromagnetic signal frequencies thereon directed to ground through said layers and said capacitors.

2. An assembly as set forth in claim 1, wherein each of said holes in the body are provided with a layer of electrical conducting material in electrical contact with the adjacent layer in the respective groove.

3. An assembly as set forth in claim 1, wherein the grooves are parallel with each other, said body being of a platable, electrically non-conducting material.

4. An assembly as set forth in claim 1, wherein the holes extend through the body whereby pins can be inserted in the holes from each side thereof.

5. An assembly as set forth in claim 1, wherein said layers are deposited by plating on said body.

6. An assembly as set forth in claim 1, wherein said body has a pair of opposed end faces and a side face, said holes spanning the distance between said end faces, said outer layer being on said side face.

7. An interface member for a multiple-pin electrical connector member comprising: a body of electrically non-conducting material, the body having a pair of opposed end faces, a side face, and a plurality of holes extending between and terminating at said end faces, each hole adapted to receive a pin of said connector member, one of the end faces having a number of grooves therein, there being a groove for each hole, respectively, each groove extending laterally from the corresponding hole to said side face of the body, each hole and each groove being provided with a layer of electrically conducting material, the layer in each groove being a pair of spaced segments, there being a capacitor in each groove in spanning relationship to said layer segments therein, said side face being provided with a layer of electrically conducting material in contact with an adjacent layer segment in each groove, respectively, there being means for grounding the layer of said side face, whereby pins received in the holes will be grounded through the capacitors in respective grooves.

8. A member as set forth in claim 7, wherein said grounding means includes a grounding conductive layer on the body, said grounding layer being adjacent to a hole through the body for receiving a metallic attachment device, said layer being adapted for electrically coupling the attachment device to the layer on the side face.

9. A member as set forth in claim 7, wherein the holes are arranged in the body in a pair of parallel rows, the body having a second side face, the holes having grooves extending to respective side faces, the second side face having a layer of electrically conducting material in contact with an adjacent layer segment in each adjacent groove, respectively, said grounding means being electrically coupled to the layer of the second side face.

10. A member as set forth in claim 7, wherein the capacitors are press-fitted or plated in place in respective grooves.

11. A member as set forth in claim 7, wherein the capacitors are held in respective grooves by an adhesive.

12. A member as set forth in claim 7, wherein the capacitors are held in respective grooves by soldering.

13. A member as set forth in claim 7, wherein said body is of platable, electrically non-conducting material.

14. An electrical connector assembly comprising: a multiple pin electrical connector member; and a filter interface member for the electrical connector, said interface member including a body of electrically non-conducting material, the body having a pair of opposed end faces, a side face, and a plurality of holes extending between and terminating at said end faces, each hole adapted to receive a pin of said connector member, one of the end faces having a number of grooves therein, there being a groove for each hole, respectively, each groove extending laterally from the corresponding hole to said side face of the body, each hole and each groove being provided with a layer of electrically conducting material, the layer in each groove being in a pair of spaced segments, there being a capacitor in each groove, respectively, in spanning relationship to the layer segments therein, said side face being provided with a layer of electrically conducting material in contact with an adjacent layer segment in each groove, respectively, there being means for coupling the layer of said side face to electrical ground, whereby the pins of said connector member will be grounded through the capacitors in respective grooves when the pins are in respective holes.

15. A member as set forth in claim 14, wherein said coupling means includes a grounding conductive layer on the body, said grounding layer being adjacent to a hole through the body for receiving a metallic attachment device, said grounding layer being adapted for electrically coupling the attachment device to the layer on the side face.

16. A member as set forth in claim 14, wherein is included a second multiple pin electrical connector member, the pins of the second connector member being receivable in said holes from a location adjacent to the other end face of said body.

* * * * *